United States Patent
Nije et al.

(10) Patent No.: US 11,150,562 B2
(45) Date of Patent: Oct. 19, 2021

(54) OPTIMIZING AN APPARATUS FOR MULTI-STAGE PROCESSING OF PRODUCT UNITS

(71) Applicant: ASML NETHERLANDS B.V., Veldhoven (NL)

(72) Inventors: Jelle Nije, Leerdam (NL); Alexander Ypma, Veldhoven (NL); Dimitra Gkorou, Eindhoven (NL); Georgios Tsirogiannis, Eindhoven (NL); Robert Jan Van Wijk, Valkenswaard (NL); Tzu-Chao Chen, San Jose, CA (US); Frans Reinier Spiering, Arnhem (NL); Sarathi Roy, Eindhoven (NL); Cédric Désiré Grouwstra, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 101 days.

(21) Appl. No.: 16/486,859

(22) PCT Filed: Feb. 22, 2018

(86) PCT No.: PCT/EP2018/054360
§ 371 (c)(1),
(2) Date: Aug. 19, 2019

(87) PCT Pub. No.: WO2018/177659
PCT Pub. Date: Oct. 4, 2018

(65) Prior Publication Data
US 2020/0233315 A1 Jul. 23, 2020

(30) Foreign Application Priority Data
Mar. 27, 2017 (EP) .................................... 17163147

(51) Int. Cl.
*G03F 7/20* (2006.01)

(52) U.S. Cl.
CPC ...... *G03F 7/70491* (2013.01); *G03F 7/70616* (2013.01)

(58) Field of Classification Search
CPC .. G03F 7/70491; G03F 7/705; G03F 7/70525; G03F 7/70616; G03F 7/70633;
(Continued)

(56) References Cited

U.S. PATENT DOCUMENTS

| | | | |
|---|---|---|---|
| 6,368,883 B1 | 4/2002 | Bode et al. | |
| 2016/0246185 A1 | 8/2016 | Ypma et al. | |

(Continued)

FOREIGN PATENT DOCUMENTS

| | | |
|---|---|---|
| CN | 1155909 | 6/2004 |
| TW | 201516598 | 5/2015 |

(Continued)

OTHER PUBLICATIONS

International Search Report and Written Opinion issued in corresponding PCT Patent Application No. PCT/EP2018/054360, dated May 3, 2018.

(Continued)

*Primary Examiner* — Colin W Kreutzer
(74) *Attorney, Agent, or Firm* — Pillsbury Winthrop Shaw Pittman LLP (57) ABSTRACT

A method of optimizing an apparatus for multi-stage processing of product units such as wafers, the method includes: receiving object data representing one or more parameters measured across the product units and associated with different stages of processing of the product units; and determining fingerprints of variation of the object data across the product units, the fingerprints being associated with different respective stages of processing of the product units. The fingerprints may be determined by decomposing the object data into components using principal component (Continued)

analysis for each different respective stage; analyzing commonality of the fingerprints through the different stages to produce commonality results; and optimizing an apparatus for processing product units based on the commonality results.

20 Claims, 7 Drawing Sheets

(58) Field of Classification Search
CPC .. G03F 7/70875; G03F 9/7007; G03F 9/7019; G06K 9/6247; H01L 22/12; H01L 22/20
USPC .......... 355/52, 53, 68, 77; 716/100
See application file for complete search history.

(56) References Cited

U.S. PATENT DOCUMENTS

| | | |
|---|---|---|
| 2016/0370710 A1 | 12/2016 | Wardenier et al. |
| 2018/0292761 A1 | 10/2018 | Cekli et al. |

FOREIGN PATENT DOCUMENTS

| | | |
|---|---|---|
| TW | 201633008 | 9/2016 |
| TW | 201708934 | 3/2017 |
| WO | 03052517 | 6/2003 |
| WO | 2014164809 | 10/2014 |
| WO | 2015024783 | 2/2015 |
| WO | 2015049087 | 4/2015 |
| WO | 2016124393 | 8/2016 |

OTHER PUBLICATIONS

Taiwanese Office Action issued in corresponding Taiwanese Patent Application No. 107108013, dated Nov. 30, 2018.
Cherry, Gregory A., et al.: "Multiblock Principal Component Analysis Based on a Combined Index for Semiconductor Fault Detection and Diagnosis", IEEE Transactions on Semiconductor Manufacturing, vol. 19, No. 2, May 1, 2006.
Taiwanese Office Action issued in corresponding Taiwanese Patent Application No. 108125154, dated Apr. 14, 2020.
Korean Office Action issued in corresponding Korean Patent Application No. 10-2019-7031430, dated Apr. 14, 2021.

Fig. 7 ic*# OPTIMIZING AN APPARATUS FOR MULTI-STAGE PROCESSING OF PRODUCT UNITS

CROSS-REFERENCE TO RELATED APPLICATIONS

This application is the U.S. national phase entry of PCT Patent Application No. PCT/EP2018/054360, filed on Feb. 22, 2018, which claims the benefit of priority of European patent application Ser. No. 17163147.6 which was filed on Mar. 27, 2017, and which is incorporated herein in its entirety by reference.

BACKGROUND

Field of the Invention

The present invention relates to a method of optimizing an apparatus for multi-stage processing of product units, usable, for example, in the manufacture of devices by lithographic techniques. An example of a multi-stage process for which the method has been developed is a multi-layer lithographic process, which includes one or more steps of transferring a pattern from a patterning device onto a substrate product unit using a lithographic apparatus. The present invention also relates to associated computer programs and computer program products, and computer apparatus.

Background Art

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned. These target portions are commonly referred to as "fields". Wafers are processed in batches or lots through various apparatuses in the semiconductor fabrication facility (fab). The integrated circuit is built up layer by layer with a lithographic step performed by a lithographic apparatus at each layer and other fab processes being performed in between lithographic steps.

Before the imaging step, various chemical and/or physical processing steps are used to form and prepare the layer for patterning. After the imaging step defines the pattern, further chemical and/or physical processing steps work through the pattern to create functional features of the integrated circuit. The imaging and processing steps are repeated in a multi-layer process to build integrated circuit.

The accurate placement of patterns on the substrate is a chief challenge for reducing the size of circuit components and other products that may be produced by lithography. In particular, the challenge of measuring accurately the features on a substrate which have already been laid down is a critical step in being able to align successive layers of features in superposition accurately enough to produce working devices with a high yield. So-called overlay should, in general, be achieved within a few tens of nanometers in today's submicron semiconductor devices, down to a few nanometers in the most critical layers.

Consequently, modern lithography apparatuses involve extensive measurement or 'mapping' operations prior to the step of actually exposing or otherwise patterning the substrate at a target location. So-called advanced alignment models have been and continue to be developed to model and correct more accurately non-linear distortions of the wafer 'grid' that are caused by processing steps and/or by the lithographic apparatus itself. Not all distortions are correctable during exposure, however, and it remains important to trace and eliminate as many causes of such distortions as possible.

Modern multi-layer lithographic processes and products are so complex that issues due to processing are difficult to trace back to the root cause. Monitoring of wafer integrity and design of an appropriate correction strategy is therefore a time-consuming and laborious exercise.

International Patent Application WO 2015049087, which is incorporated by reference herein in its entirety, discloses a method of obtaining diagnostic information relating to an industrial process. Alignment data or other measurements are made at stages during the performance of the lithographic process to obtain object data representing positional deviation or other parameters measured at points spatially distributed across each wafer. Overlay and alignment residuals typically show patterns across the wafer, known as fingerprints. This object data is used to obtain diagnostic information by performing a multivariate analysis to decompose the set of vectors representing the wafers in multidimensional space into one or more component vectors. Diagnostic information about the industrial process is extracted using the component vectors. The performance of the industrial process for subsequent wafers can be controlled based on the extracted diagnostic information.

Even with such an approach, it is difficult to understand where yield loss comes from. Conventional methods of analysis involve trial and error. In a multi-layer process substrates are processed through the layers as quickly as possible. The phenomena that lead to yield loss can change rapidly over time and the severity of the impact on yield loss is constantly changing too. If the analysis takes a long time, either because it takes time to obtain product performance or yield data or because the analysis itself is time-consuming, then the impact on yield can become very large.

Thus a limitation with current performance monitoring, control and process apparatus optimization systems is that there is a compromise between the amount of time and equipment dedicated to performance monitoring, and the speed and accuracy with which corrections can be implemented.

It would be desirable to have a performance monitoring system that can detect problems at an early stage, rather than only detecting them when some performance parameter exceeds permissible limits.

Process corrections may be made at wafer-level in addition to per-lot or per-chuck. Therefore it is important to make an integral choice for the interdependent alignment and overlay correction strategies, since alignment is essentially also a wafer-level correction mechanism. Such an integral optimization is a difficult task, which is conventionally performed in isolation, for example, for alignment and overlay per layer. This may also be applied to co-optimization of overlay/alignment, focus/leveling and critical dimension (CD).

Inter-layer complexity makes it difficult to do an integral optimization of alignment and overlay correction strategy. Furthermore, there are multiple control loops running simultaneously which start to interact increasingly more (e.g. lens heating, reticle writing error and wafer shape feedforward in combination with wafer alignment, leveling, wafer-level control, and Advanced Process Control). In addition, conventional simulation and modeling approaches often operate in an isolated fashion, without an overall flow to connect the pieces together into an integrally optimized system. For example, overlay correction simulations have to be redone after a new alignment marker type is proposed. Or, for example, the benefit of a different alignment strategy needs to be recomputed after a different wafer-level control strategy is proposed (which also corrects wafer to wafer variation). Or a fingerprint may be removed altogether from the data after a certain processing change (e.g. fixing the annealing recipe) or alignment strategy change (moving to a higher-order model, different alignment illumination color or different sampling scheme) is introduced. It is desirable to have one flow that allows for simulating the overlay (plus focus and CD) benefit using what-if scenarios, where the inter-layer and inter-control-loop complexity is accounted for.

SUMMARY

The inventors have devised a way to provide real-time, context-driven root cause analysis and correction advice. It may be used for optimizing an apparatus for multi-layer processing of substrates, while avoiding or at least mitigating one or more of the associated problems mentioned above.

The invention in a first aspect provides a method for optimizing multi-stage processing of product units, the method comprising: (a) receiving object data representing one or more parameters measured on a plurality of product units at different stages of processing; (b) determining fingerprints of variation of the object data across each product unit out of the plurality of product units, the fingerprints being associated with different respective stages of processing; (c) analyzing commonality of the fingerprints through the different stages of processing to produce commonality results; and (d) optimizing an apparatus used for processing product units based on the commonality results.

The invention in a second aspect provides a computer program comprising computer readable instructions which, when run on suitable computer apparatus, cause the computer apparatus to perform the method of the first aspect.

The invention in a third aspect provides a computer program product comprising the computer program of the second aspect.

The invention in a fourth aspect provides an apparatus specifically adapted to carry out the steps of the method of the first aspect.

BRIEF DESCRIPTION OF THE DRAWINGS/FIGURES

Embodiments of the invention will now be described, by way of example, with reference to the accompanying drawings in which.

DETAILED DESCRIPTION

Before describing embodiments of the invention in detail, it is instructive to present an example environment in which embodiments of the present invention may be implemented.

Figure 1:
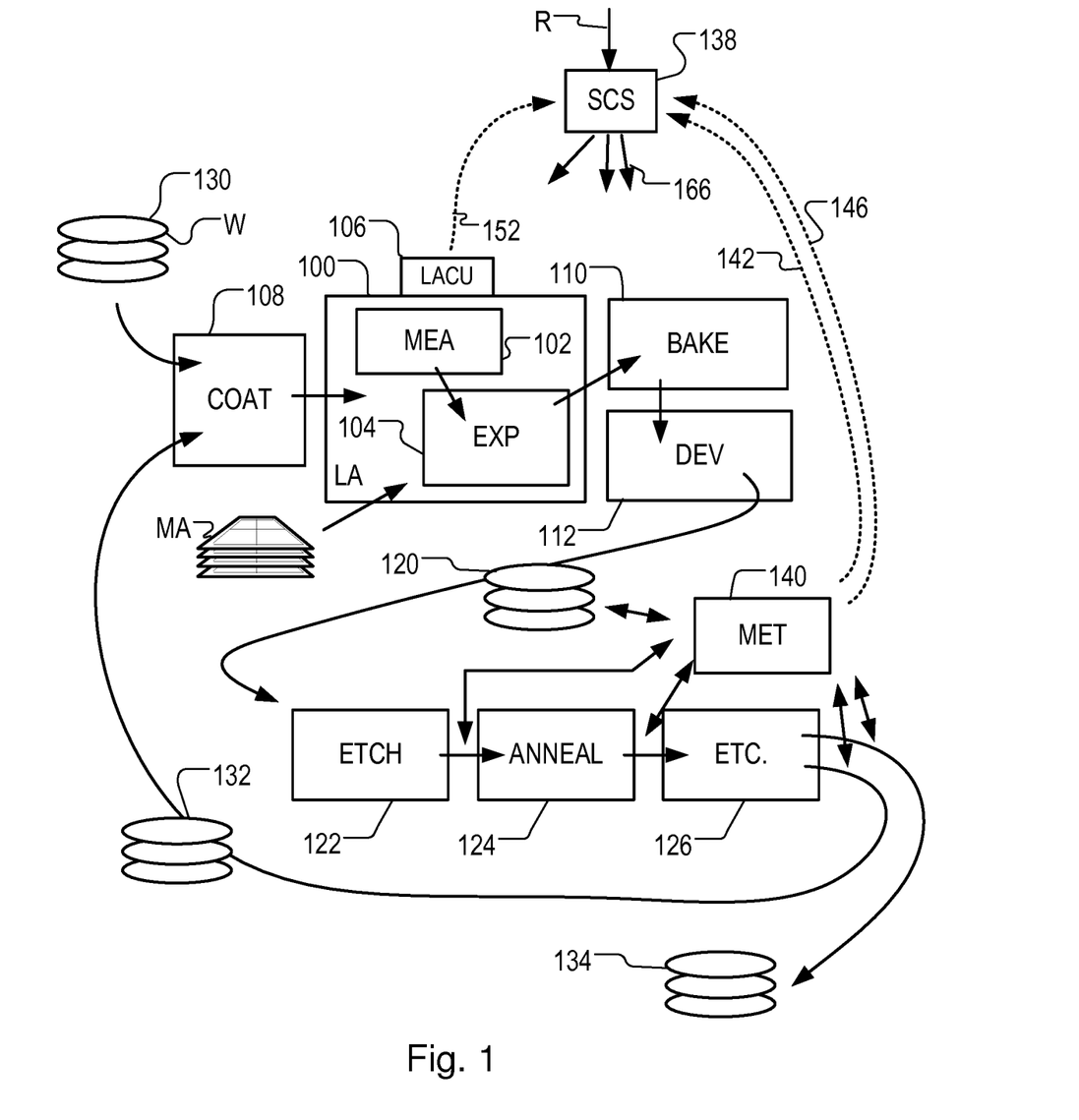
FIG. 1 depicts a lithographic apparatus together with other apparatuses forming a production facility for semiconductor devices.

FIG. 1 at 100 shows a lithographic apparatus LA as part of an industrial facility implementing a high-volume, lithographic manufacturing process. In the present example, the manufacturing process is adapted for the manufacture of for semiconductor products (integrated circuits) on substrates such as semiconductor wafers. The skilled person will appreciate that a wide variety of products can be manufactured by processing different types of substrates in variants of this process. The production of semiconductor products is used purely as an example which has great commercial significance today.

Within the lithographic apparatus (or "litho tool" 100 for short), a measurement station MEA is shown at 102 and an exposure station EXP is shown at 104. A control unit LACU is shown at 106. In this example, each substrate visits the measurement station and the exposure station to have a pattern applied. In an optical lithographic apparatus, for example, a projection system is used to transfer a product pattern from a patterning device MA onto the substrate using conditioned radiation and a projection system. This is done by forming an image of the pattern in a layer of radiation-sensitive resist material.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. The patterning MA device may be a mask or reticle, which imparts a pattern to a radiation beam transmitted or reflected by the patterning device. Well-known modes of operation include a stepping mode and a scanning mode. As is well known, the projection system may cooperate with support and positioning systems for the substrate and the patterning device in a variety of ways to apply a desired pattern to many target portions across a substrate. Programmable patterning devices may be used instead of reticles having a fixed pattern. The radiation for example may include electromagnetic radiation in the deep ultraviolet (DUV) or extreme ultraviolet (EUV) wavebands. The present disclosure is also applicable to other types of lithographic process, for example imprint lithography and direct writing lithography, for example by electron beam.

The lithographic apparatus control unit LACU controls all the movements and measurements of various actuators and sensors, causing the apparatus to receive substrates W and reticles MA and to implement the patterning operations. LACU also includes signal processing and computing capacity to implement desired calculations relevant to the operation of the apparatus. In practice, control unit LACU will be realized as a system of many sub-units, each handling the real-time data acquisition, processing and control of a subsystem or component within the apparatus.

Before the pattern is applied to a substrate at the exposure station EXP, the substrate is processed in at the measurement station MEA so that various preparatory steps may be carried out. The preparatory steps may include mapping the surface height of the substrate using a level sensor and measuring the position of alignment marks on the substrate using an alignment sensor. The alignment marks are arranged nominally in a regular grid pattern. However, due to inaccuracies in creating the marks and also due to deformations of the substrate that occur throughout its processing, the marks deviate from the ideal grid. Consequently, in addition to measuring position and orientation of the substrate, the alignment sensor in practice must measure in detail the positions of many marks across the substrate area, if the apparatus is to print product features at the correct locations with very high accuracy.

The lithographic apparatus LA may be of a so-called dual stage type which has two substrate tables, each with a positioning system controlled by the control unit LACU. While one substrate on one substrate table is being exposed at the exposure station EXP, another substrate can be loaded onto the other substrate table at the measurement station MEA so that various preparatory steps may be carried out. The measurement of alignment marks is therefore very time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations. When lithographic apparatus LA is of a so-called dual stage type which has two substrate tables, the exposure station and the measurement station may be distinct locations between which the substrate tables can be exchanged. This is only one possible arrangement, however, and the measurement station and exposure station need not be so distinct. For example, it is known to have a single substrate table, to which a measurement stage is temporarily coupled during the pre-exposure measuring phase. The present disclosure is not limited to either type of system.

Within the production facility, apparatus 100 forms part of a "litho cell" or "litho cluster" that contains also a coating apparatus 108 for applying photosensitive resist and other coatings to substrates W for patterning by the apparatus 100. At an output side of apparatus 100, a baking apparatus 110 and developing apparatus 112 are provided for developing the exposed pattern into a physical resist pattern. Between all of these apparatuses, substrate handling systems take care of supporting the substrates and transferring them from one piece of apparatus to the next. These apparatuses, which are often collectively referred to as the "track", are under the control of a track control unit which is itself controlled by a supervisory control system SCS, which also controls the lithographic apparatus via lithographic apparatus control unit LACU. Thus, the different apparatuses can be operated to maximize throughput and processing efficiency. Supervisory control system SCS receives recipe information R which provides in great detail a definition of the steps to be performed to create each patterned substrate.

Once the pattern has been applied and developed in the litho cell, patterned substrates 120 are transferred to other processing apparatuses such as are illustrated at 122, 124, 126. A wide range of processing steps is implemented by various apparatuses in a typical manufacturing facility. For the sake of example, apparatus 122 in this embodiment is an etching station, and apparatus 124 performs a post-etch annealing step. Further physical and/or chemical processing steps are applied in further apparatuses, 126, etc. Numerous types of operation can be required to make a real device, such as deposition of material, modification of surface material characteristics (oxidation, doping, ion implantation etc.), chemical-mechanical polishing (CMP), and so forth. The apparatus 126 may, in practice, represent a series of different processing steps performed in one or more apparatuses.

As is well known, the manufacture of semiconductor devices involves many repetitions of such processing, to build up device structures with appropriate materials and patterns, layer-by-layer on the substrate. Accordingly, substrates 130 arriving at the litho cluster may be newly prepared substrates, or they may be substrates that have been processed previously in this cluster or in another apparatus entirely. Similarly, depending on the required processing, substrates 132 on leaving apparatus 126 may be returned for a subsequent patterning operation in the same litho cluster, they may be destined for patterning operations in a different cluster, or they may be finished products to be sent for dicing and packaging.

Each layer of the product structure requires a different set of process steps, and the apparatuses 126 used at each layer may be completely different in type. Further, even where the processing steps to be applied by the apparatus 126 are nominally the same, in a large facility, there may be several supposedly identical machines working in parallel to perform the step 126 on different substrates. Small differences in set-up or faults between these machines can mean that they influence different substrates in different ways. Even steps that are relatively common to each layer, such as etching (apparatus 122) may be implemented by several etching apparatuses that are nominally identical but working in parallel to maximize throughput. In practice, moreover, different layers require different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

In order that the substrates that are exposed by the lithographic apparatus are exposed correctly and consistently, it is desirable to inspect exposed substrates to measure properties such as overlay errors between subsequent layers, line thicknesses, critical dimensions (CD), etc. Accordingly a manufacturing facility in which litho cell LC is located also includes metrology system MET which receives some or all of the substrates W that have been processed in the litho cell. Metrology results are provided directly or indirectly to the supervisory control system (SCS) 138. If errors are detected, adjustments may be made to exposures of subsequent substrates, especially if the metrology can be done soon and fast enough that other substrates of the same batch are still to be exposed. Also, already exposed substrates may be stripped and reworked to improve yield, or discarded, thereby avoiding performing further processing on substrates that are known to be faulty. In a case where only some target portions of a substrate are faulty, further exposures can be performed only on those target portions which are good.

Also shown in FIG. 1 is a metrology apparatus 140 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure properties of the developed substrates at 120 prior to etching in the apparatus 122. Using metrology apparatus 140, it may be determined, for example, that important performance parameters such as overlay or critical dimension (CD) do not meet specified accuracy requirements in the developed resist. Prior to the etching step, the opportunity exists to strip the developed resist and reprocess the substrates 120 through the litho cluster. As is also well known, the metrology results 142 from the apparatus 140 can be used to maintain accurate performance of the patterning operations in the litho cluster, by supervisory control system SCS and/or control unit LACU 106 making small adjustments 166 over time, thereby minimizing the risk of products being made out-of-specification, and requiring re-work. Of course, metrology apparatus 140 and/or other metrology apparatuses (not shown) can be applied to measure properties of the processed substrates 132, 134, and incoming substrates 130.

An embodiment of the present invention gives the ability to characterize the full stack of layers through the lifecycle of an integrated circuit, by using a lithographic apparatus with its built in sensors to capture fingerprints through the stack of layers. This characterization is correlated to the process steps in between exposures defining each layer. The analysis of fingerprints through the stack of layers provides the capability to correct for the phenomena in the multi-layer process which are complex and time varying. For example, new equipment and new process recipes are constantly generating new fingerprints.

The lithographic apparatus has many in-line sensors in addition to alignment sensors. These include leveling sensors, sensors for aligning the reticle to the wafer stage chuck (e.g. "transmission image sensors" or "parallel integrated lens interferometer" type sensors) and sensors related to actuator stability. The lithographic apparatus' sensors are examples of sensors that can measure values of parameters spatially distributed across substrates. As well as a fingerprint representing the spatial distribution across the substrate, a fingerprint may represent a distribution of a process parameter across different wafers of a wafer lot. For example a fingerprint obtained from "parallel integrated lens interferometer" sensors could represent a reticle heating signature across the wafer lot. Embodiments of the present invention utilize these sensors to characterize many or all individual processes (for example etch, deposition, develop track). This is possible as the scanner is involved at least once during fabrication of a layer on a wafer. The scanner can apply its sensors to all wafers passing through the lithographic process at least once per layer.

The scanner sensors used to determine a fingerprint may be dynamic. For example, for one layer the alignment sensor may be found to be most useful to determine a fingerprint representative for a process step, while for another layer a levelling sensor may be more informative. The use of sensors and the combination of sensor signals that yields most representative results (e.g. most informative for process control and processing apparatus optimization) may be subject to change and machine learning approaches may be used to converge to a per-layer optimal sensor signal constellation (e.g. layer 1: alignment color 1, layer 2: alignment color 2+leveling, . . . etc.)

As mentioned above, the wafers are processed through the stack of layers, the lithographic apparatus can capture the fingerprints at all the different steps. Fingerprint patterns can be related to each other by performing a through-stack analysis and fingerprints common across layers can be related back to events and phenomena occurring at each layer. This makes possible to properly optimize the processing apparatuses for subsequent process steps. These subsequent process steps performed by the optimized apparatus may be applied to the wafers from which the fingerprints were obtained. In that case, the corrections are applied during the processing of a wafer through its stack of layers, as a kind of real-time correction. This is an example of optimizing an apparatus for processing product units from which the object data was measured, at subsequent stages in the multi-stage processing. The subsequent process steps performed by the optimized apparatus may apply to steps throughout the processing of other wafers, including wafers processed in future. The optimized apparatus may be used to perform process steps at earlier as well as later stages in the process flow than the stage at which the analysis and optimization is performed. The optimization can involve fixing an identified process apparatus and/or process recipe. It can also involve using dedicated scanner corrections via alignment or overlay corrections.

Embodiments of the present invention provide a means to relate fingerprints through the stack of processing stages (e.g. layers) to each other and to identify them in terms of variations of an underlying fingerprint, that can then be linked back to the process context.

Figure 2:
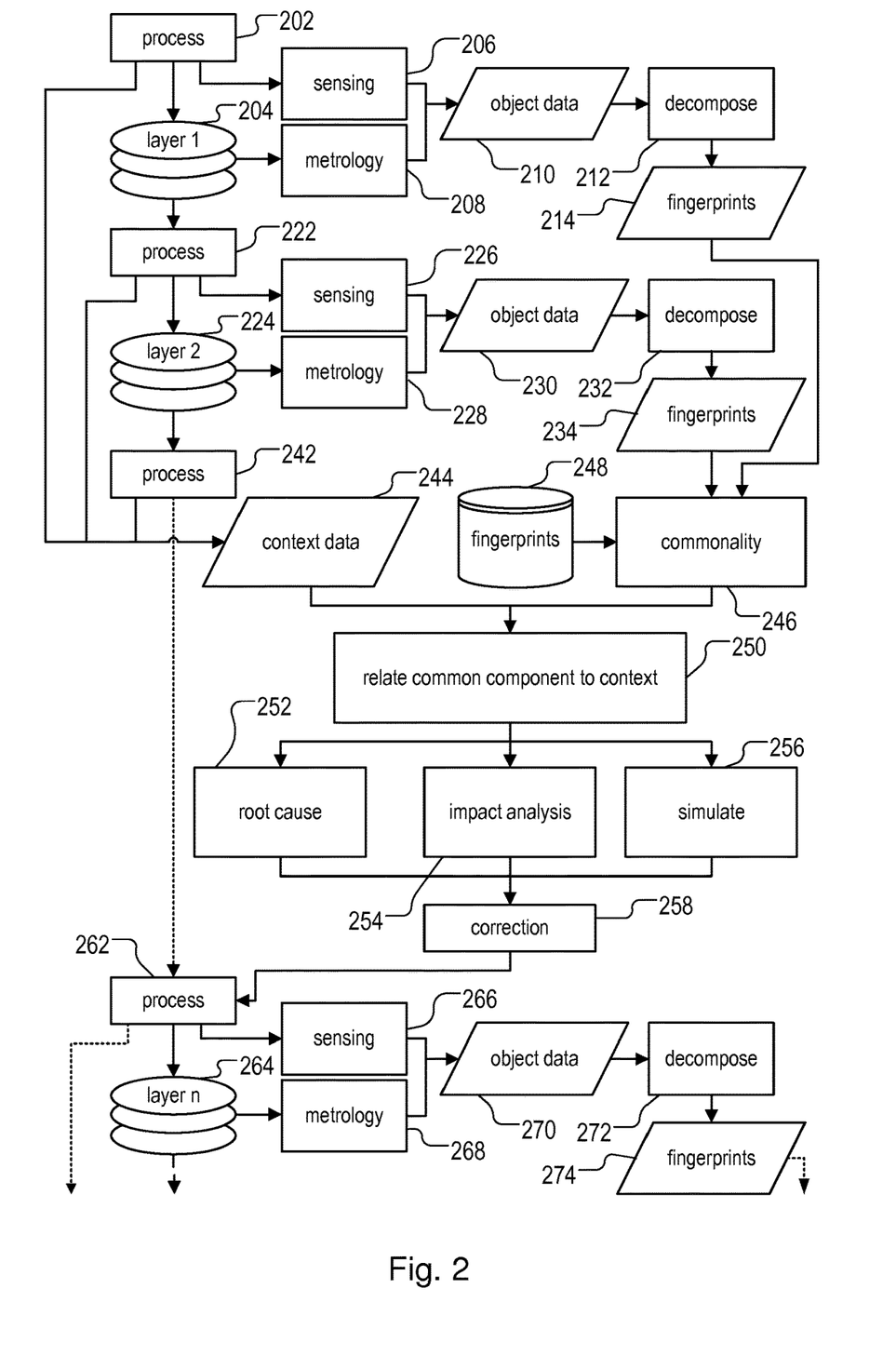
FIG. 2 is a flowchart of a method according to an embodiment of the present invention.

FIG. 2 is a flowchart illustrating a method of optimizing an apparatus for multi-stage processing of product units, according to an embodiment of the present invention. In this example, the product units are substrates, in particular wafers. In this example, the stages correspond to layers of the wafers. In some processes, such as double patterning processes, each layer may be exposed in two separate litho-etch stages.

The multi-layer process begins with raw wafers (not shown) being subjected to a fab process 202. This could for example include a deposition step and an anneal step, followed by the coat, exposure, bake and develop steps illustrated in FIG. 1. This produces wafers 204 with a first layer that is patterned.

The wafers 204 are subjected to further fab processing 222, which could for example include etch and anneal steps as illustrated in FIG. 1, followed by coat, exposure, bake and develop steps for patterning the second layer. This produces wafers 224 with a second layer that is patterned.

The processing continues through subsequent layers with more fab processing 242, that may include lithographic steps (not shown), leading up to subsequent fab processing 262 produce wafers 264 having a subsequent layer that is patterned.

The apparatus used for the fab processes 202, 222, 242, 262 includes one or more lithographic apparatus, also referred to as a scanner, used to perform the exposures. Scanners have sensors for sensing 206, 226, 266 one or more parameters across the wafers. One example of such a sensor is an alignment sensor. Other examples of sensors that measure across the wafer are discussed below. Furthermore, for each of the layers shown, metrology 208, 228, 268 is performed on the patterned wafers (for example, as shown at 140 in FIG. 1).

The sensing and metrology steps produce object data for each layer 210, 230, 270.

Thus, considering layers 1 and 2, a computing apparatus, for example SCS in FIG. 1, receives object data 210, 230 representing one or more parameters measured 206, 208 across wafers 204, 224 and associated with different stages 202, 222 of processing of the wafers.

The computing apparatus decomposes 212, 232 the object data 210, 230 into components for each different respective layer. The computing apparatus thereby determines fingerprints of variation of the object data across each of the wafers 214, 234. The fingerprints are thus associated with different respective stages of processing of the wafers, corresponding to respective layers of the wafers. The decomposing 212, 232 in this example uses principal component analysis (PCA) of the object data 210, 230 to obtain orthogonal principal components.

The computing apparatus analyzes 246 commonality of the fingerprints 214, 234 through the different layers to produce commonality results. The analysis may include identifying at least one of the fingerprints that is common through the different layers. Analyzing commonality of the fingerprints may involve using user interaction. This may be done by rendering a dashboard showing the fingerprints arranged by layer and receiving user input identifying the fingerprint or fingerprints that are common through the different layers. This visualization of fingerprint progression through the layer stack enables the user to interactively optimize and engage with the optimization method. The commonality analysis may be partly or entirely automated. This automation can involve using a computing apparatus for grouping of fingerprints. A fingerprint library 248 may be used to perform the automated grouping. The fingerprint library 248 may be made up of historical fingerprints. The grouping may be based on analyzing the difference (or distance) between determined fingerprints and historical fingerprints.

If the commonality analysis does not identify any common fingerprints, then that result is itself useful information. It indicates that the optimization is free to be continued by using another way of prioritizing the root cause analysis, impact analysis or modelling to provide corrective actions.

The computing apparatus uses the commonality results to optimize an apparatus for processing 262 of subsequent layers, as discussed below.

The computing apparatus in this example receives context data 244 representing one or more parameters of processing 202, 222, 242 of the different layers of the wafers 204, 224. The optimization of the apparatus for processing of subsequent layers is then based on the identified 246 fingerprint or fingerprints and the context data 244. This is achieved by relating the identified common finger print or fingerprints to context data.

The optimization may involve determining the root cause by relating 250 the identified 246 fingerprint or fingerprints to the context data 244 to identify 252 a specific apparatus that should be optimized (e.g. fixed) before processing of subsequent stages. In effect this is labeling the fingerprints by a context match. This process may be automated.

The optimization may involve impact analysis 254, which may predict metrology results, probe measurements, voltage contrast measurements, or even product yield. This may be performed by predicting variation of product performance across wafers based on the identified fingerprint or fingerprints 246 and the received context data 244 to determine a process correction 258 to apply to the apparatus for processing 262 of subsequent stages. As a specific example, when the object data comprises alignment data, the fingerprints comprise alignment fingerprints, and the predicted variation comprises variation of overlay between layers including a subsequent layer. Embodiments of the invention in this way provide improved alignment/overlay control optimization by predictive metrology using selective synthesis-based overlay prediction.

The optimization may involve the computing apparatus modeling or simulating 256 processing of subsequent layers based on the identified 246 common fingerprint or fingerprints and the context data 244 to determine a process correction to apply to the apparatus for processing 262 of subsequent stages.

The optimization of the apparatus for processing of subsequent layers involves determining a correction 258. The correction is applied to a processing apparatus of the fab process 262 as a corrective action. The corrective action may be for example an apparatus fix, apparatus shutdown, recipe change or change to apparatus settings.

Figure 3:
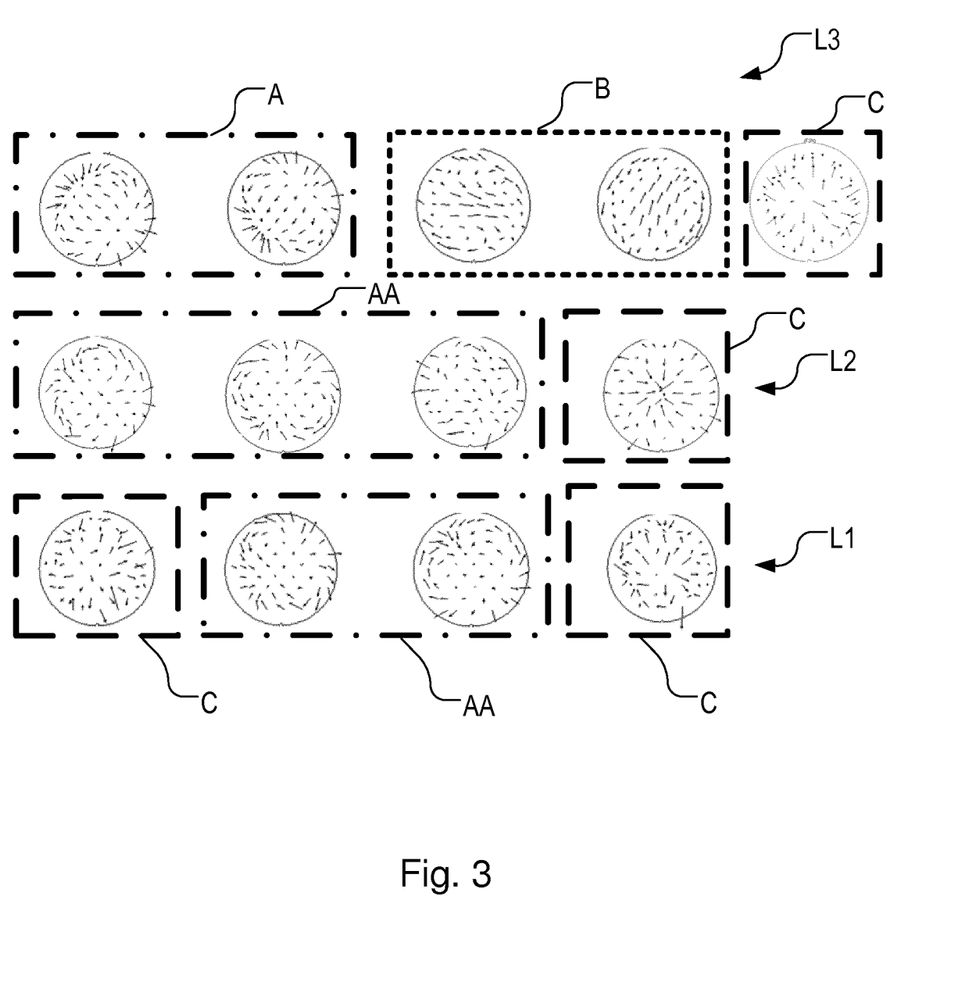
FIG. 3 illustrates a dashboard for Principal Component Analysis (PCA) based through-layer fingerprint analysis.

FIG. 3 illustrates a dashboard for Principal Component Analysis (PCA)-based through-layer fingerprint analysis.

Three rows of fingerprints are shown. Each row has fingerprints from a different layer, L1, L2, L3. The PCA provides an orthonormal set of fingerprints per layer. These may be derived as described in WO 2015049087, mentioned above. Each fingerprint is shown as a circle corresponding to a wafer, with arrows representing the variation at locations across a set of wafers. The fingerprint is not a measurement as such. It is derived from object data obtained from many wafers. A fingerprint is the pattern of variation which is occurring more often in a set of wafers. For example, it may represent the average variation across a set of wafers. The variation may occur in some wafers of the set, but not in all. In this example the principal components are laid out with the most significant component left. The orthogonality of the basis for expressing the fingerprints is advantageous because it minimizes dependencies between correction strategies for the processing apparatus optimization.

The dotted and dashed lines indicate the grouping of fingerprints. The grouping may be performed manually, semi-automatically or automatically. The fingerprints labeled C ("Type C") are scaling fingerprints which are common to layers L1, L2, and L3. The fingerprints labeled A and AA resemble each other and are a known dual-swirl pattern that typically links to anneal processing steps. The dual swirl can appear at slightly different angles and can be sampled differently by the scanner sensors. Instead of doing a per-layer optimization, groups of similar fingerprints can be recognized that may be related to the same root cause. For example looking at the fingerprints labeled A and AA, the fingerprints could link back to one anneal apparatus. It is useful to be able to understand what would happen if the anneal apparatus could be tuned in order to make the comment fingerprint vanish in layer L1 and subsequent layers. This would then have implications for the alignment strategy at layer L1.

As an example, the following steps may be used in the synthesis-based optimization flow when applied to a lithographic process:

A. Decompose alignment through the stack of layers, as shown in FIG. 3. This approach uses the alignment and overlay tree and uses a decomposition into uncorrelated or otherwise informative components (fingerprints) underlying the measurement data (e.g. wafer align).

B. Assign components that are common across layers to context (i.e. root cause analysis). A data mining method may be used to associate processing context (steps/recipes, tool usage, inline tool measurements) automatically to fingerprint occurrence on the wafers.

C. Map alignment and context to overlay (i.e. predictive metrology). This is described below in more detail with reference to FIG. 4. This predictive metrology method may be used to synthesize overlay using selective use of alignment fingerprints and additional overlay exposure and metrology effects. The selective use stems from different alignment and/or overlay control and metrology strategies to be evaluated. This may be done, for example, via a generative model (probabilistic generative model, deep neural network, etc.) which is trained to map alignment and leveling data to overlay under diverse (process-) contextual conditions.

D. Simulate different alignment (taking into account the model, marks, sampling and alignment tree).

E. Predict overlay impact from the different alignment model. This step and the previous step are described in more detail with reference to FIG. 5 below.

F. Predict overlay impact from different APC (Advance Process Control) model.

Figure 4:
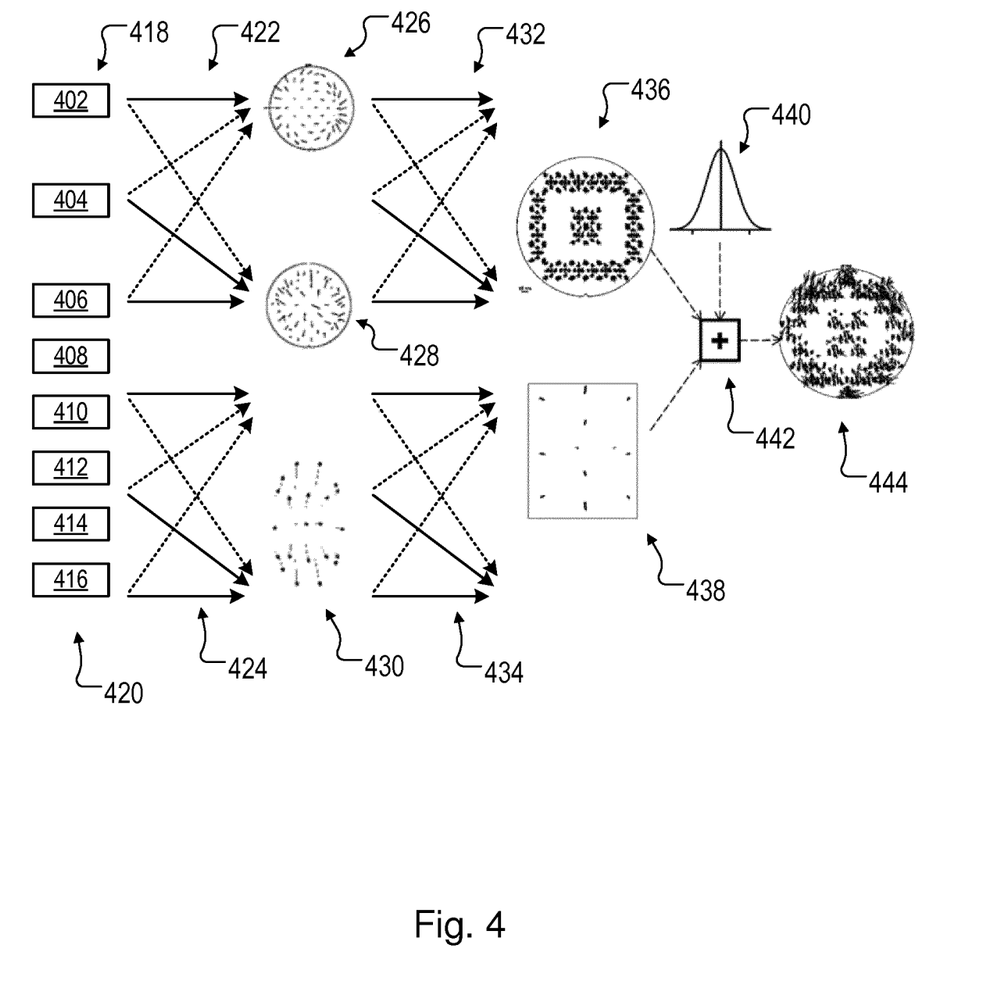
FIG. 4 illustrates an example of a generative, component-based, synthesis approach to overlay impact simulation.

FIG. 4 illustrates an example of a generative, component-based, synthesis approach to (overlay) impact simulation. This generative approach is useful for component-decomposition through-stack and provides a basis for predictive metrology.

The predictive overlay impact analysis illustrated in FIG. 4 predicts overlay maps 444 based on fingerprint occurrence expected on the wafer. By including different fingerprints for wafer 426, 428 and field 430 effects, the final overlay wafer map 444 is synthesized from the fingerprints that are expected to occur on a wafer given the contextual measurements 418, 420 that describe the processing and exposure conditions for the wafer. The fingerprints can either be learned from data (where a noise model is included to prevent measurement noise from interfering with the fingerprint learning), for example by a PCA decomposition, or be included from prior knowledge, e.g. transmission image sensor field magnification drift typically leads to a reticle heating related intrafield fingerprint pattern.

The training data includes fab routing and alignment data 418 from various processing tools 402, 404, 406. Other training data 420 includes servo performance, wafer table temperature, Application Specific CALibration (ASCAL) data (used to predict lens heating effect by measuring wavefront drift), focus spot monitor data, wafer leveling data and matching and scanner control data. This other training data 420 is training data from servos 408, reticles 410, scanner lenses 412, wafer stages 414 and wafer tables 416.

The dotted arrows represent probabilistic relations between context, fingerprints and overlay.

For mapping fab context 418 to interfield fingerprints 426, 428, co-occurrence mapping 422 may be used as described in WO 2015049087. For mapping scanner context 420 to intrafield fingerprints 430, regression 424 may be used, such as partial least squares (PLS) regression and principal component regression (PCR).

The interfield fingerprint 428 corresponds to the layer 1, "Type C" fingerprint shown in FIG. 3. The interfield fingerprint 426 is another variant of the "Type A" fingerprint (say, "Type AAA").

Mappings 432, 434 for predicting overlay impact from the intermediate fingerprint layer 426 to 430 can be learned empirically from data. When exposure and processing conditions do not change, these mappings can be used to assess the overlay impact relating to the occurrence of certain scanner metrology fingerprints in the data. For a lithographic process simulation scheme, such an empirical mapping can be used to assess the overlay impact of removing/remedying certain fingerprints by simulated corrective actions.

In its simplest form mappings 432, 434 can be deterministic mappings (e.g. a linear or nonlinear function) to compute overlay values at the wafer from inter- and intrafield fingerprints, as disclosed in WO 2015049087. Here we exploit it for synthesis ('prognosis'), rather than context analysis ('root cause analysis' or 'diagnostics').

Interfield PCA may be used in order to get from the fingerprints 426, 428 to the predicted interfield overlay 436. An intrafield PCA drift model may be used in order to get from the fingerprint 430 to the predicted intrafield overlay 438. A suitable empirical mapping method is described in International Patent Application WO 2015024783, which is incorporated by reference herein in its entirety.

The predicted fingerprints 436 and 438 are combined 442 with the noise model 440 to produce the final overlay wafer map 444.

Thus, measured overlay is used to teach the system. When the system has been trained, it is used to predict overlay based on a subset of remaining fingerprints (or residuals to them) through-stack. As illustrated on FIG. 5 and in further steps the predicted overlay becomes progressively smaller, because more corrective actions are applied.

Figure 5:
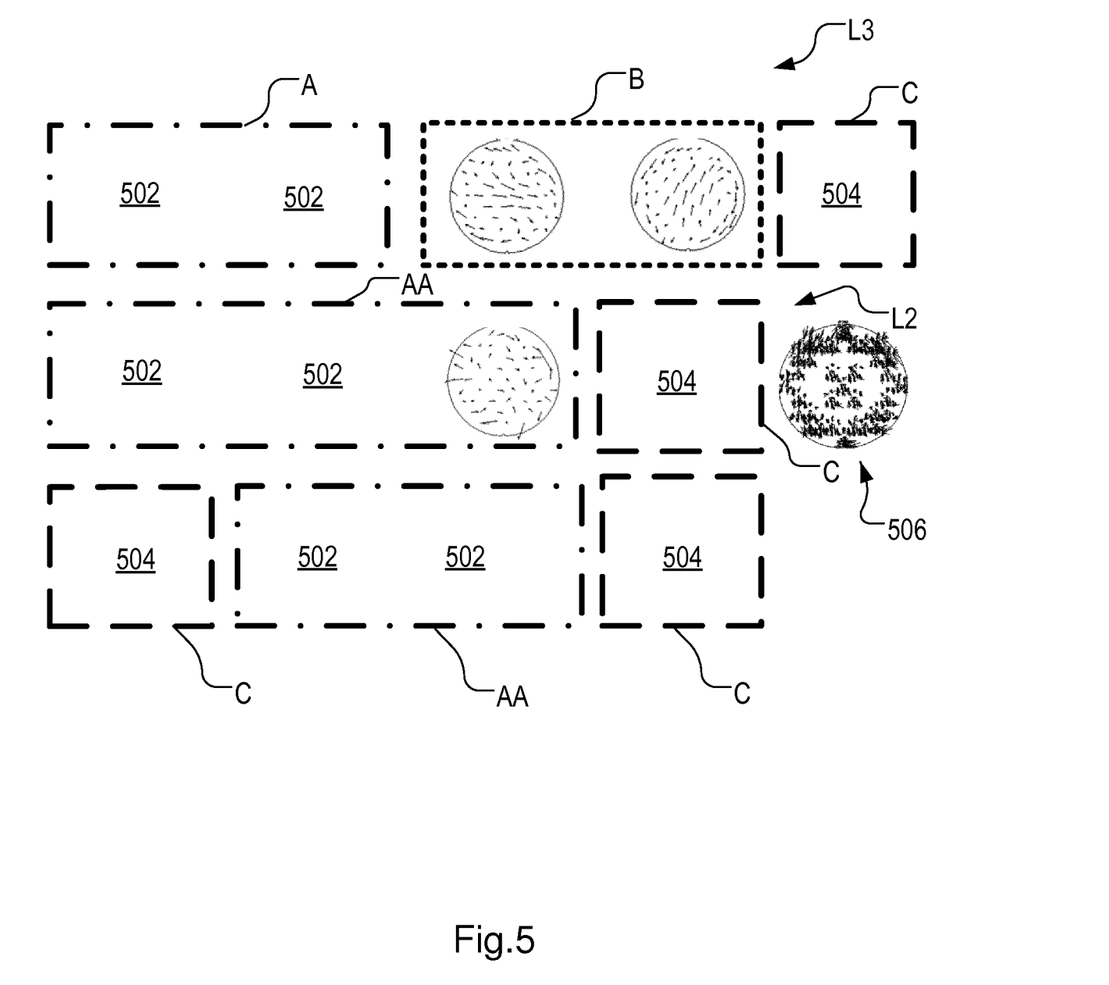
FIG. 5 illustrates the dashboard for Principal Component Analysis (PCA) based through-layer fingerprint analysis after simulated corrective actions are applied.

FIG. 5 illustrates the dashboard for Principal Component Analysis (PCA) based through-layer fingerprint analysis after simulated corrective actions are applied.

One of the advantages of using orthogonal fingerprints is that fixing one of the sources of variation, by simulating absence of a fingerprint as if the root cause is identified and fixed, is also removing the fingerprint through-stack, potentially simplifying the control simulation.

FIG. 5 illustrates the dashboard shown in FIG. 3, with common reference symbol A, B, C, AA, L1, L2 and L3 representing the same features. However FIG. 5 also shows simulated fingerprint removal by simulated process tuning 502 and different alignment strategy evaluation 504. Process tuning removes most of the "Type A" and "Type AA" fingerprints. Alignment strategy evaluation removes all of the "Type C" fingerprints. The resulting overlay impact assessment of the corrective action of removing those fingerprints is shown at 506.

As an example of alignment strategy evaluation, if fingerprint "Type C" is from deformed markers, an alignment strategy using a different alignment color (wavelength) may solve this problem thus removing the "Type C" fingerprint. An alternative might be to use a different marker layout that is less sensitive to edge marker deformation.

In further steps (not shown), more fingerprints can be removed from the dashboard, further improving expected overlay impact. For example, after simulating a higher-order alignment model, more of the fingerprint variation can be captured, hence less is present in overlay. The higher-order alignment model can be considered yet another alignment strategy to be evaluated, further improving expected overlay impact, given the empirical mapping between alignment and overlay that has been trained.

Thus, embodiments of the present invention may provide integral optimization of alignment and overlay per-wafer correction via a synthesis-based fingerprint dashboard through the stack of layers. The synthesis-based optimization method of this example is centered around a thru-stack fingerprint development dashboard, as described with reference to FIGS. 3 to 5 above.

Embodiments of the present invention enable integral optimization of alignment and overlay strategy, with user interaction. Since the overlay prediction may be implemented via a knowledge- and fingerprint-based synthesis, training a monolithic mapping from context to overlay maps (e.g. by neural networks) may be circumvented. A predictive metrology method is provided that generalizes well to contextual conditions not present in the training set. Mappings between variables are split into locally connected subset of variables; these 'sub-mappings' can be implemented using black-box models (e.g. neural networks), white-box models (e.g. knowledge-based) or grey-box models (e.g. Bayesian networks using hybrid of physical modeling, neural networks and probabilistically combining). This allows for predictive metrology that can adapt to changing data characteristics or at least detect significant deviations from the training data characteristics.

As depicted in FIG. 3, per layer (each layer applied during a separate stage of processing of the product units) a decomposition of the object data fingerprints is performed. The components may be sorted based on their relevance, such that the most relevant component (eg explaining most of the variation of the object data across the product units) is at the left and the least relevant component at the right. Effectively the components are then ranked to their usability in predicting the properties of a fingerprint of object data across a product unit.

Besides ranking of components (on relevance) also other attributes may be assigned to each of the components, for example the attribute data may comprise an indicator of reliability of the determined component (accuracy and/or reproducibility) or an expected criticality of the component for the yield of the process.

Often the components and ranking of the components associated with a first stage of processing match those associated with a second stage of processing subsequent to the first stage of processing. This observation may be used to derive the correction 258 to an apparatus utilized in performing said second stage of processing based on knowledge of the fingerprints associated with the first stage of processing. In an example an apparatus configured to pattern a second layer subsequent to a first layer may use object data associated with the first layer to control patterning of the second layer. For example optimization of an apparatus used during said second stage of processing may take the fingerprints associated with the first stage of processing as an input.

It may be the case that the components are similar across the layers, but the ranking of the components varies between layers. For example a first component associated with a second stage of processing is ranked first, while this component is ranked second when associated with a first stage of processing. Hence there is certainly commonality of components between the stages of processing (eg layers), but they may have different attributes, such as their ranking. Typically the components are associated with fingerprints of object data comprising one or more performance parameters (overlay, focus, CD, . . . ).

Controlling the second stage of processing based on knowledge of components associated with the first stage of processing may still be possible, but differences in ranking may need to be considered in order to provide accurate corrections to the second stage of processing. In an embodiment control of the second stage of processing is based on a weighted set of components associated with the first stage of processing. In case a first component associated with a second layer is ranked lower than for a first layer, control of the second stage of processing needs to assign less weight to the first component as it is less representative of variation of object data than another higher ranked component.

In general the concept of feeding forward information associated with a first stage of processing to a second stage of processing is then based on both commonality of components and attributes associates with the components. As said, the attribute may refer to a measure of relevance (ranking), a measure of reliability (accuracy, reproducibility) or a measure of expected impact on yield of the process as a whole (impact on the end-product).

Controlling the second stage of processing may then be based on a weighted sum of components associated with the first stage of processing. Alternatively the control of the second stage of processing may be based on a weighted sum of processing corrections associated with the first stage of processing.

The weighting is done by multiplying each component '$Ci$' associated with the first stage of processing with a weight factor '$Wi$' which is based on a value of the attribute of interest, typically associated with the second stage of processing. When the attribute of interest is relevance of the component, the weight factor may be selected based on a ranking number. For example when a component is ranked second for a first stage of processing and ranked fourth for a second stage of processing the weight factor associated with that component may be chosen as a ratio between the rankings (2:4=0.5). Subsequent optimization of an apparatus or process utilized in performing the second stage of processing may then be based on a weighted sum of components, wherein the component only has a weight factor of 0.5.

Determining all (or a subset of) common components between a first and a second stage of processing for a given substrate (wafer) may then be followed by determining for each component an associated weight factor based on the attributes of the common components for both the first and second stage of processing. The weighted sum of the components is deemed to be representative for a fingerprint of object data across the to be controlled substrate. Based on the obtained weighted sum of components optimization of an apparatus and/or control actions such as process corrections may be determined.

One or more of the weight factors may be set to zero, for example when a certain component has an associated measure of reliability below a certain minimum value (threshold). In an analog manner also components which are ranked lower than $3^{rd}$ may be set to zero. Effectively less reliable (constant) and/or relevant components are then filtered out to improve robustness of controlling the second stage of processing.

In addition to optimization of processing apparatus and control actions also monitoring of the attributes associated with the components may be implemented. Changes in these attributes may be indicative of changes within one or more process steps and/or stages of processing. These changes may be excursions, drifts, or abrupt changes (for example due to sudden changes in configuration of processing equipment).

In addition to an optimization/control strategy based on feed-forward of information of a first layer to a process control of a second layer, more generic feed forward strategies may be adopted. In general commonality between fingerprints (or components associated with the fingerprints) across the whole stack of layers may be determined for control purposes. This concept may easily be extended by including analysis of attribute data associated with each of the layers comprised within the entire stack of layers. Control of any stage of processing may then be based on commonality of components across the stack while taking attributes associated with these common components for each individual stage of processing into account.

In general process control for a stage of processing is then based on a) commonality between components across any subset of layers applied to the substrate, and b) attribute data associated with common components across said subset of layers applied to the substrate.

In an example a fifth stage of processing is controlled based on 2 components associated with the fifth stage of processing which are common to all four preceding stages of processing. Attributes of components are available for all 5 stages of processing, the attribute data relating to ranking of the components (relevance). In this example the control of processing a substrate during the fifth stage of processing is based on a first and second common component, each component weighted based on the attribute data for all four preceding layers.

In an embodiment the component is weighted by multiple weight factors 'Wij', each weight factor 'Wij' associated with a component 'Ci' and a stage of processing 'j'. The weighted component 'Cweighted' can then be expressed as: 'Cweighted'=sum(Wij*Ci).

In addition to providing the optimized alignment and/or overlay (wafer) strategy it is often necessary to determine the effectiveness of such an optimization (compared to a strategy where no such optimization is implemented). Often a first performance data set (for example alignment data, overlay data or any other data type indicative for the performance of a semiconductor manufacturing process) obtained by measurement on product units processed before a correction is implemented and a second performance data set obtained by measurement on product units processed after implementation of the optimization are available. Typically a Key Performance Indicator (KPI) is evaluated for the first performance data set and for the second performance data set. Comparing the KPI values is then often the preferred strategy to assess the effectiveness of the optimization (correction) to the manufacturing process. However the performance data sets may be heterogeneous, eg the first and second performance parameter data sets may have been obtained from different data sources, may have statistically different types of distribution (symmetry of the distribution, sample points constituting the distribution). The KPI for the first performance data set may hence not be adequate to assess the quality of the second performance parameter data set. Hence a direct comparison of the values of the KPI may not be a valid approach when evaluating the effectiveness of the optimization.

In a further embodiment it is proposed to compare the first and the second performance data sets based on their underlying Probability Density Functions (PDF). Such a method is more suitable to determine the effectiveness of the optimization. For example a kernel density estimation method is utilized to derive a first PDF associated with the first performance parameter data set and a second PDF associated with the second performance parameter data set.

The first performance parameter data set is associated with a first control strategy associated with a first class of alignment or overlay corrections applied to the semiconductor manufacturing process (for example before optimizing a process and/or processing tool) and the second performance parameter data set is associated with a second control strategy associated with a second class of alignment or overlay corrections applied to the semiconductor manufacturing process. The change from going from the first class of corrections to the second class of corrections is referred to as a change in the control strategy.

Figure 6:
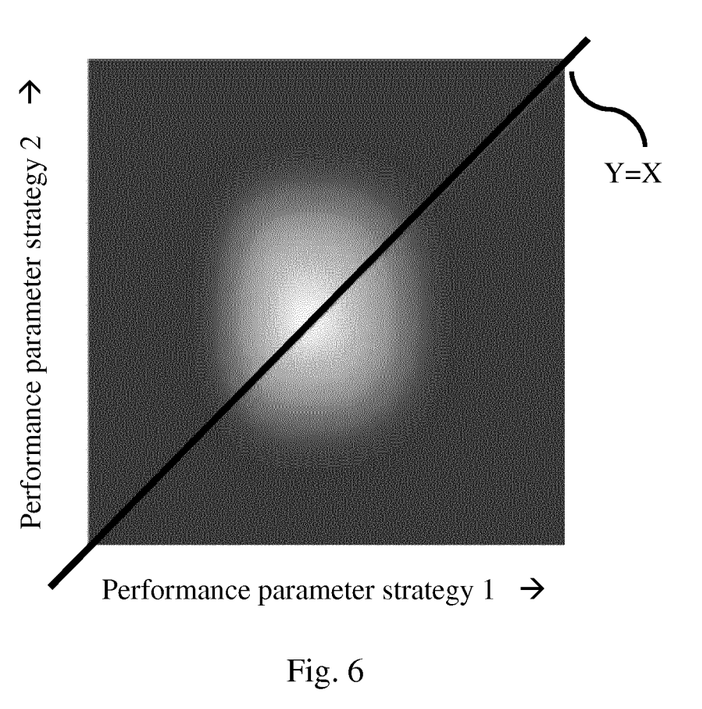
FIG. 6 illustrates a two-dimensional density plot used to assess effectiveness of control strategies.

Once the first PDF and second PDF have been determined a two-dimensional density plot is constructed. FIG. 6 depicts the two-dimensional density plot, with on the x-axis the value of the performance parameter associated with the first data set and on the y-axis the value of the performance parameter associated with the second data set. The density plot is generated by evaluation of the product of the first PDF and the second PDF for (x,y) values corresponding to performance parameter values. The two-dimensional density plot expresses for a certain combination of a performance parameter value associated with the first control strategy and the performance parameter value associated with to second control strategy the probability of occurrence.

If the effectiveness of the first and second control strategy would be identical the two-dimensional density plot would be symmetrical in the line Y=X. In case the second control strategy would be more effective the second PDF would return higher probability values for lower values on the Y-axis, hence the two-dimensional density plot would become asymmetric and in this case the centre of gravity of the density plot would shift below the Y=X line. The latter property may be used to assess the effectiveness of a control strategy, or alternatively rank a plurality of performance data sets. An integrated value of a first region of the two-dimensional density plot above the Y=X line may be compared to an integrated value of a second region of the two-dimensional density plot below the Y=X line. From the ratio between the integrated values it can be deduced which of the two performance data sets is associated with the most effective control strategy. Subsequently the most effective control strategy may be chosen for further processing.

In an embodiment the apparatus for processing product units is optimized according to any previous embodiment as disclosed in this document. Further evaluation of the effectiveness of the optimization of the apparatus is achieved by executing a method comprising a step of ranking performance data sets, the step of ranking performance data sets comprising: (a) determining a first probability density function associated with a first performance data set obtained by measurements on product units processed before optimizing the apparatus for processing product units based on the commonality results; (b) determining a second probability density function associated with a second performance data set obtained by measurements on product units processed after optimizing the apparatus for processing product units based on the commonality results; and (c) ranking said performance data sets based on the first probability density function and the second probability density function. Based on the ranking the effectiveness of the optimization of the apparatus can be determined.

In an embodiment the first and second probability density functions are determined using a kernel density estimation method.

In an embodiment step (c) comprises a step of generating distributions of co-ordinates, wherein a first distribution of a first co-ordinate is derived from sampling the first probability density function and a second distribution of a second co-ordinate is derived from sampling the second probability density function.

In an embodiment step (c) further comprises mapping the first distribution of first co-ordinates and the second distribution of second co-ordinates to a two-dimensional density plot having a first axis associated with values of the performance data of the first performance data set and a second axis associated with values of the performance data of the second performance data set.

In an embodiment step (c) further comprises a step of integrating values of the density plot across a first region of the two-dimensional density plot and a step of integrating values of a second region of the two-dimensional density plot, wherein the first region is associated with a value of co-ordinates of the second axis being larger or equal than the value of co-ordinates of the first axis and the second region is associated with a value of co-ordinates of the second axis being smaller or equal than the value of co-ordinates of the first axis.

In an embodiment the integrated values of the first and second region are used to rank the performance data.

In an embodiment the ranking is used to select the first or the second control strategy applied to the semiconductor manufacturing process for subsequent processing.

An embodiment of the invention may be implemented using a computer program containing one or more sequences of machine-readable instructions describing methods of optimizing an apparatus for multi-stage processing of product units, as described above. This computer program may be executed within a computing apparatus, such as control unit LACU of FIG. 1, or some other controller. There may also be provided a data storage medium (e.g., semiconductor memory, magnetic or optical disk) having such a computer program stored therein.

Figure 7:
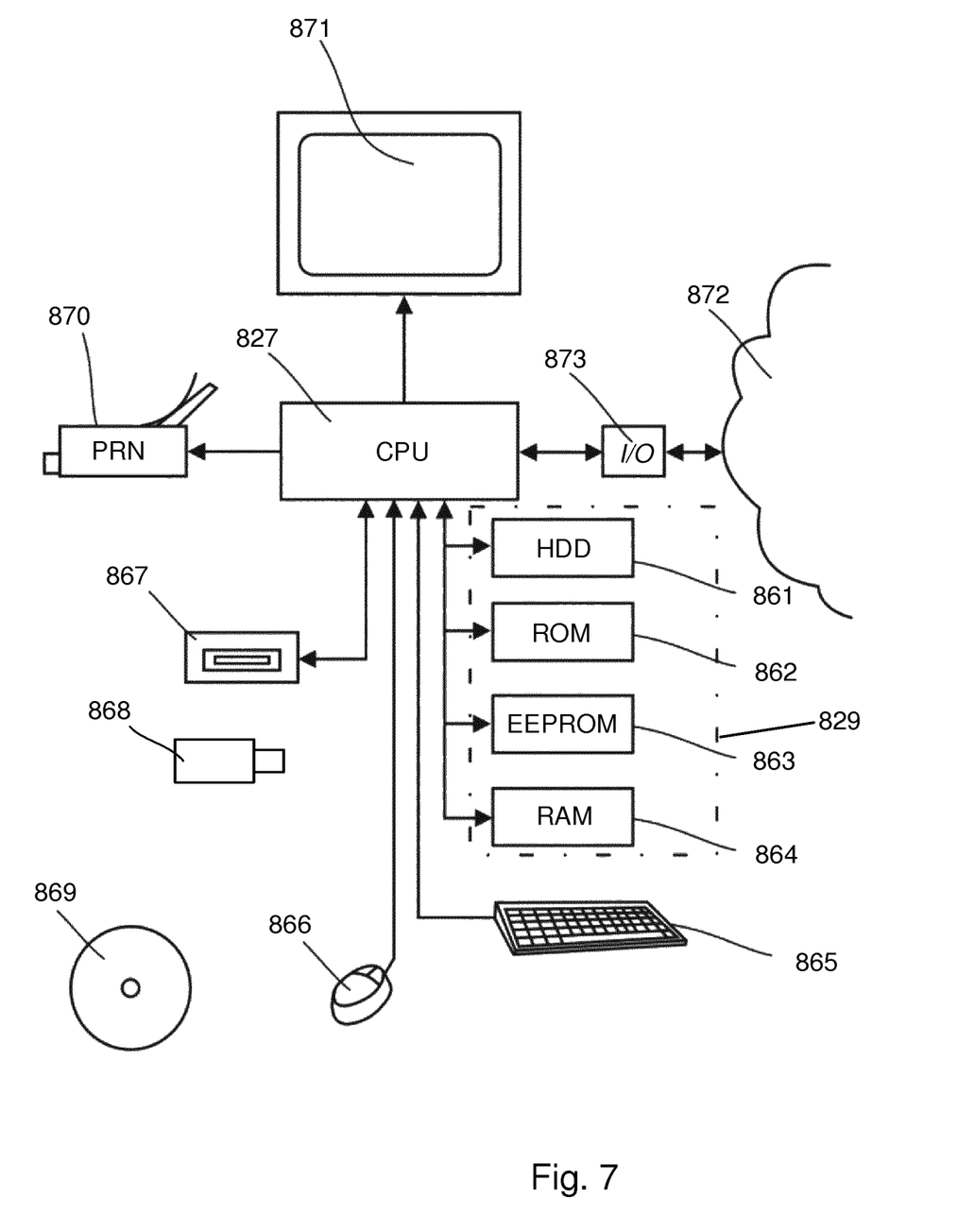
FIG. 7 illustrates computing apparatus hardware useful in implementing the methods disclosed herein.

This control unit LACU may include a computer assembly as shown in FIG. 7. The computer assembly may be a dedicated computer in the form of a control unit in embodiments of the assembly according to the invention or, alternatively, be a central computer controlling the lithographic apparatus. The computer assembly may be arranged for loading a computer program product comprising computer executable code. This may enable the computer assembly, when the computer program product is downloaded, to control aforementioned uses of a lithographic apparatus with embodiments of the level and alignment sensors AS, LS.

Memory 829 connected to processor 827 may comprise a number of memory components like a hard disk 861, Read Only Memory (ROM) 862, Electrically Erasable Programmable Read Only Memory (EEPROM) 863 and Random Access Memory (RAM) 864. Not all aforementioned memory components need to be present. Furthermore, it is not essential that aforementioned memory components are physically in close proximity to the processor 827 or to each other. They may be located at a distance away.

The processor 827 may also be connected to some kind of user interface, for instance a keyboard 865 or a mouse 866. A touch screen, track ball, speech converter or other interfaces that are known to persons skilled in the art may also be used.

The processor 827 may be connected to a reading unit 867, which is arranged to read data, e.g. in the form of computer executable code, from and under some circumstances store data on a data carrier, like a solid-state drive 868 or a CDROM 869. Also DVD's or other data carriers known to persons skilled in the art may be used.

The processor 827 may also be connected to a printer 870 to print out output data on paper as well as to a display 871, for instance a monitor or LCD (Liquid Crystal Display), of any other type of display known to a person skilled in the art.

The processor 827 may be connected to a communications network 872, for instance a public switched telephone network (PSTN), a local area network (LAN), a wide area network (WAN) etc. by means of transmitters/receivers 873 responsible for input/output (I/O). The processor 827 may be arranged to communicate with other communication systems via the communications network 872. In an embodiment of the invention external computers (not shown), for instance personal computers of operators, can log into the processor 827 via the communications network 872.

The processor 827 may be implemented as an independent system or as a number of processing units that operate in parallel, wherein each processing unit is arranged to execute sub-tasks of a larger program. The processing units may also be divided in one or more main processing units with several sub-processing units. Some processing units of the processor 827 may even be located a distance away of the other processing units and communicate via communications network 872. Connections between modules can be made wired or wireless.

The computer system can be any signal processing system with analogue and/or digital and/or software technology arranged to perform the functions discussed here.

Further embodiments of the invention are disclosed in the list of numbered embodiments below:

1. A method of optimizing an apparatus for multi-stage processing of product units, the method comprising: (a) receiving object data representing one or more parameters measured on a plurality of product units at different stages of processing; (b) determining fingerprints of variation of the object data across each product unit out of the plurality of product units, the fingerprints being associated with different respective stages of processing; (c) analyzing commonality of the fingerprints through the different stages to produce commonality results; and (d) optimizing the apparatus for processing product units based on the commonality results.
2. The method of embodiment 1, wherein the step (b) of determining fingerprints comprises decomposing the object data into components for each different respective stage.
3. The method of embodiment 2, wherein decomposing comprises using principal component analysis of the object data to obtain orthogonal principal components.
4. The method of any preceding embodiment, wherein the step (c) of analysing commonality comprises identifying at least one of the fingerprints that is common through the different stages.
5. The method of embodiment 4, wherein step (c) of analysing commonality of the fingerprints comprises rendering a dashboard showing the determined fingerprints arranged by stage and receiving user input identifying the at least one of the fingerprints that is common through the different stages.
6. The method of any preceding embodiment, wherein step (d) of optimizing an apparatus for processing product units comprises optimizing an apparatus for processing the product units from which the object data was measured at subsequent stages in their multi-stage processing.
7. The method of embodiment 2 or 3, wherein the components receive attribute data.

8. The method of embodiment 7, wherein the attribute data is indicative for one or more of: relevance of the component in explaining the variation of object data across the product units, reliability of the component and/or expected yield of the process given observance of the component.

9. The method of embodiment 7 or 8, wherein step d) of optimizing the apparatus is based on the commonality results and the attribute data.

10. The method of embodiment 9, wherein the step d) of optimizing the apparatus is based on weighting components with a weight factor based on values of attribute data associated with these components for at least two stages of processing.

11. The method of embodiment 10, wherein the weight factor is based on the ratio between first values of the attribute data for a first stage of processing and second values of the attribute data for a second stage of processing.

12. The method of embodiment 10 or 11, wherein the weight factor is set to zero in case attribute data indicates a certain component to be of one or more of: low relevance, low reliability.

13. The method of any preceding embodiment, further comprising the step of (e) receiving context data representing one or more parameters of processing of the different stages of processing of the product units, wherein the step (d) of optimizing an apparatus for processing of subsequent stages is based on the identified at least one fingerprint and the context data.

14. The method of embodiment 13, wherein the step (d) of optimizing an apparatus for processing of subsequent stages comprises relating the identified at least one fingerprint to the received context data to identify a specific apparatus for processing of subsequent stages.

15. The method of embodiment 13, wherein the step (d) of optimizing an apparatus for processing of subsequent stages comprises predicting variation of product performance across product units based on the identified at least one fingerprint and the received context data to determine a process correction to apply to the apparatus for processing of subsequent stages.

16. The method of embodiment 15, wherein the object data comprises alignment data, the fingerprints comprise alignment fingerprints, the stages comprise layers, and the predicted variation comprises predicted variation of overlay between layers including a subsequent layer.

17. The method of embodiment 13, wherein the step (d) of optimizing an apparatus for processing of subsequent stages comprises simulating processing of subsequent stages based on the identified at least one fingerprint and the received context data to determine a process correction to apply to the apparatus for processing of subsequent stages.

18. The method of any preceding embodiment, wherein the product units are substrates.

19. The method of embodiment 1, further comprising a step of ranking performance data sets, the step of ranking performance data sets comprising:
(a) determining a first probability density function associated with a first performance data set obtained by measurements on product units processed before optimizing the apparatus for processing product units based on the commonality results;
(b) determining a second probability density function associated with a second performance data set obtained by measurements on product units processed after optimizing the apparatus for processing product units based on the commonality results; and
(c) ranking said performance data sets based on the first probability density function and the second probability density function.

20. The method of embodiment 19, wherein the first and second probability density functions are determined using a kernel density estimation method.

21. A computer program comprising computer readable instructions which, when run on suitable computer apparatus, cause the computer apparatus to perform the method of any of embodiments 1 to 20.

22. A computer program product comprising the computer program of embodiment 21.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method of optimizing an apparatus for multi-stage processing of product units, the method comprising:
receiving object data representing one or more parameters measured on a plurality of product units at different stages of processing;
determining fingerprints of variation of the object data across each product unit out of the plurality of product units, the fingerprints being associated with different respective stages of processing;
analyzing commonality of the fingerprints through the different stages to produce commonality results; and
optimizing the apparatus used for processing product units, based on the commonality results.

2. The method of claim 1, wherein the determining fingerprints comprises decomposing the object data into components for each different respective stage.

3. The method of claim 2, wherein decomposing comprises using principal component analysis of the object data to obtain orthogonal principal components.

4. The method of claim 1, wherein the analyzing commonality comprises identifying at least one of the fingerprints that is common through the different stages.

5. The method of claim 4, wherein the analyzing commonality comprises rendering a dashboard showing the determined fingerprints arranged by stage of processing and receiving user input identifying the at least one of the fingerprints that is common through the different stages.

6. The method of claim 1, wherein the optimizing the apparatus comprises optimizing the apparatus for processing the product units from which the object data was measured, at subsequent stages in their multi-stage processing.

7. The method of claim 1, further comprising receiving context data representing one or more parameters of processing of the different stages of processing of the product units, wherein the optimizing the apparatus is based on the context data and on the commonality results.

8. The method of claim 7, wherein the optimizing the apparatus comprises relating the commonality results to the received context data to identify a specific apparatus as the apparatus being optimized.

9. The method of claim 7, wherein the optimizing the apparatus comprises predicting variation of product performance across product units based on the commonality results and the received context data to determine a process correction to apply to the apparatus.

10. The method of claim 9, wherein the object data comprises alignment data, the fingerprints comprise alignment fingerprints, the stages comprise layers, and the predicted variation comprises predicted variation of overlay between layers including a subsequent layer.

11. The method of claim 1, further comprising ranking performance data sets, the ranking performance data sets comprising:
  determining a first probability density function associated with a first performance data set obtained by measurements on product units processed before an optimization, based on the commonality results, of the apparatus for processing product units;
  determining a second probability density function associated with a second performance data set obtained by measurements on product units processed after an optimization, based on the commonality results, of the apparatus for processing product units; and
  ranking the performance data sets based on the first probability density function and the second probability density function.

12. The method of claim 7, wherein the optimizing the apparatus comprises simulating processing of subsequent stages based on the commonality results and on the context data, to determine a process correction to apply to the apparatus.

13. The method of claim 2, wherein the components receive attribute data.

14. The method of claim 13, wherein the attribute data is indicative for one or more selected from: relevance of the component in explaining the variation of object data across the product units, reliability of the component, and/or expected yield of the process given observance of the component.

15. The method of claim 13, wherein the optimizing the apparatus is based on the commonality results and on the attribute data.

16. The method of claim 15, wherein the optimizing the apparatus is based on weighting components with a weight factor based on values of attribute data associated with these components for at least two stages of processing.

17. The method of claim 16, wherein the weight factor is based on a ratio between first values of the attribute data for a first stage of processing and second values of the attribute data for a second stage of processing.

18. The method of claim 16, wherein the weight factor is set to zero in case attribute data indicates a certain component to be of low relevance and/or low reliability.

19. A non-transitory computer-readable program product comprising instructions therein, the instructions, upon execution by a computer system, configured to cause the computer system to at least:
  receive object data representing one or more parameters measured on a plurality of product units at different stages of processing;
  determine fingerprints of variation of the object data across each product unit out of the plurality of product units, the fingerprints being associated with different respective stages of processing;
  analyze commonality of the fingerprints through the different stages to produce commonality results; and
  optimize an apparatus used for processing product units, based on the commonality results.

20. The computer-readable program product of claim 19, wherein the instructions configured to determine fingerprints are further configured to decompose the object data into components for each different respective stage.

* * * * *